(12) United States Patent
Skultety-Betz et al.

(10) Patent No.: US 7,952,687 B2
(45) Date of Patent: May 31, 2011

(54) MEASURING DEVICE

(75) Inventors: Uwe Skultety-Betz, Leinfelden-Echterdingen (DE); Bjoern Haase, Stuttgart (DE); Joerg Stierle, Waldenbuch (DE); Peter Wolf, Leinfelden-Echterdingen (DE); Kai Renz, Leinfelden-Echterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 11/911,183

(22) PCT Filed: Jun. 28, 2006

(86) PCT No.: PCT/EP2006/063622
§ 371 (c)(1),
(2), (4) Date: Oct. 10, 2007

(87) PCT Pub. No.: WO2007/014808
PCT Pub. Date: Feb. 8, 2007

(65) Prior Publication Data
US 2008/0151217 A1 Jun. 26, 2008

(30) Foreign Application Priority Data
Aug. 1, 2005 (DE) .................. 10 2005 036 037

(51) Int. Cl.
*G01C 3/08* (2006.01)
(52) U.S. Cl. ........ 356/4.01; 356/3.01; 356/3.1; 356/4.1; 356/5.1
(58) Field of Classification Search ........ 356/3.01–28.5, 356/139.01–139.1
See application file for complete search history.

(56) References Cited

U.S. PATENT DOCUMENTS

| | | | | |
|---|---|---|---|---|
| 5,386,084 A | * | 1/1995 | Risko | 174/564 |
| 5,469,982 A | | 11/1995 | Gordecki et al. | |
| 5,926,260 A | * | 7/1999 | Dunne et al. | 356/5.05 |
| 6,179,122 B1 | * | 1/2001 | Moncrief et al. | 206/320 |
| 6,249,113 B1 | | 6/2001 | Krantz et al. | |
| 7,259,837 B2 | | 8/2007 | Stierle et al. | |
| 2002/0093639 A1 | * | 7/2002 | Haga | 356/4.01 |
| 2004/0239914 A1 | | 12/2004 | Stierle et al. | |
| 2006/0272154 A1 | * | 12/2006 | Brevard | 30/41 |

FOREIGN PATENT DOCUMENTS

| | | |
|---|---|---|
| CN | 1429296 | 7/2003 |
| CN | 1610818 | 4/2005 |
| EP | 1154062 | 11/2001 |
| WO | 81/00654 | 3/1981 |
| WO | 2005/068303 | 7/2005 |

* cited by examiner

*Primary Examiner* — Thomas H Tarcza
*Assistant Examiner* — Luke D Ratcliffe
(74) *Attorney, Agent, or Firm* — Michael J. Striker

(57) ABSTRACT

The invention relates to measuring device, particularly a distance measuring device for contactlessly measuring distance, comprising a housing (12) made of at least one first material and with at least one electronic component (56), which is arranged inside an interior (48) of the housing (12), as well as with a second material that at least partially surrounds the housing (48). The invention provides that the second material also seals at least one opening (63) of the housing interior (48). The invention also relates to a method for producing a measuring device of the aforementioned type during which the second material is provided as a sealing element that seals at least one opening of the housing interior.

17 Claims, 2 Drawing Sheets

MEASURING DEVICE

CROSS-REFERENCE TO RELATED APPLICATIONS

This application is the national stage entry of PCT/EP06/63622, filed 18 Jun. 2006 and claims priority under 35 U.S.C. 119(a)-(d) to German Patent Application DE 102005036037.8, filed 1 Aug. 2005.

BACKGROUND OF THE INVENTION

The invention relates to a measuring device, in particular a distance measuring device for contactless distance measurement, and to a method for manufacturing a measuring device of its kind.

PRIOR ART

Measuring devices, which as a rule have a plurality of electronic components contained inside their housings, usually have a rigid housing in order to protect their electronic components from physical shocks, for example.

There are known measuring devices that have an impact protection, for example, in the form of elastic elements provided on the housing exterior.

It is also known, particularly in hand-held measuring devices, to provide a so-called soft component in a region of the housing exterior, which can advantageously be embodied in the form of a grip element for the measuring device.

Thus for example, U.S. Pat. No. 6,249,113 B1 has disclosed a measuring device for locating metallic objects concealed in a wall, which device has four shell-shaped elastomer components in its grip region, which enclose the edges of the measuring device and combine to form an elastic grip element for this measuring device.

In addition to providing a sufficient mechanical protection of the sensitive electronic components of a measuring device, these elastomer components are also intended produce a reliable seal to prevent the penetration of dirt and moisture. To achieve this, the housing interior that accommodates the electronic components must be thoroughly sealed in relation to the housing exterior. In order to seal openings into the housing interior, which are indispensable, for example, for producing an electrical contact, currently, fluid seals are usually used, which harden after application. The metering of such fluid seals is difficult, so that process reliability in the manufacture of measurement devices must be viewed as critical.

SUMMARY OF THE INVENTION

The measuring device according to the present invention, which can be embodied, for example, in the form of a distance measuring device for contactless distance measurement, has a housing comprised of at least one first material, for example a plastic, and whose housing interior contains at least one electronic component, but as a rule a plurality of them. In addition, the measurement device according to the invention has a second material at least partially encompassing the housing. According to the invention, this second material advantageously also seals at least one opening of the housing interior. Because the second material situated on the housing exterior of the measurement device also simultaneously seals an opening of the housing interior, it is possible to eliminate the use of an additional sealing material.

In the manufacturing method according to the invention for a measuring device of this kind, the second material at least partially encompassing the housing of the device is simultaneously embodied in the form of a sealing element that seals at least one opening of the housing interior. Consequently, this second material can perform not only its function on the housing exterior, but can also be used as a sealing element of the housing interior.

Advantageous embodiments and modifications of the measuring device according to the invention and of the manufacturing method for such a measuring device are possible by means of the steps taken in the dependent claims.

The second material at least partially encompassing the housing of the measuring device is advantageously integrally joined to the sealing element of an opening of the housing interior.

For example, the second material can form an extrusion coating on the housing so that it can be embodied as a grip region, for example on the housing exterior. It is likewise possible for the second material to provide an impact protection on the housing exterior of the measuring device.

The second material is advantageously embodied in the form of an elastic material.

In a particularly advantageous embodiment of the measuring device manufacturing method according to the invention, the housing and the grip region, which are essentially composed of two different materials, can be produced in a combined two-component injection molding process. Thus, for example, at least one conduit can be provided in the housing, which makes it possible for the second material to travel from the housing exterior to the housing interior and seal at least one opening of the housing interior there. It is thus possible to both attach a soft component to the housing exterior and to form a sealing element, which seals the housing interior, using one and the same material and in one work step, more or less.

It is thus possible, for example, for the measuring device according to the invention to have a recess or compartment for batteries and for this battery compartment to be sealed in relation to the housing interior by means of the second material. It is particularly possible according to the invention for this seal of the battery compartment to be embodied as integrally joined to a soft component on the housing exterior of the measuring device. It is thus possible for the rubber-like soft material, which is used for example for the grip region of the measuring device, to be conveyed to a housing opening through a conduit embodied in the material of the housing. The elastic material, which closes this housing opening into the housing interior, can then, during subsequent assembly of the measuring device, particularly during installation of the electrical contacts, be easily penetrated by them so that the thin skin over the housing opening provided by the second material fits snugly against the contacts and thus assures a seal between the housing interior and the housing exterior, for example a battery compartment.

With the measuring device manufacturing method according to the invention, in particular for a distance measuring device, it is possible to reliably seal the housing interior in relation to the housing exterior, without having to use an additional sealing material for this sealing process. In particular, it is possible, for example, for a snug connection between electrical contact elements, which feed from the housing interior to the housing exterior, for example to a battery compartment, to be sealed without using additional sealing materials in that the sealing element that produces the seal is comprised of a material that is attached to the housing exterior.

Other advantages of the method according to the invention and of a measuring device manufactured in accordance with this method are disclosed in the description associated with the following drawings.

DRAWINGS

The drawings show an exemplary embodiment of a measuring device according to the invention, which will be explained in greater detail in the description that follows. The figures in the drawings, their description, and the claims contain numerous features in combination. Those skilled in the art will also suitably consider these features individually and unite them in other meaningful combinations.

DETAILED DESCRIPTION OF THE INVENTION

Figure 1:
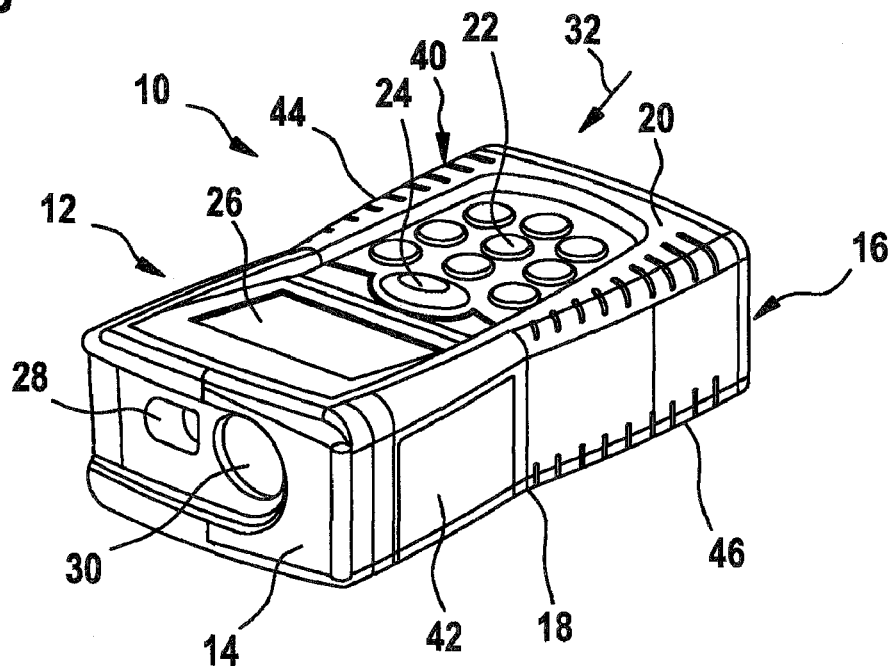
FIG. 1 is a perspective general view of an exemplary embodiment of a measuring device according to the invention.

FIG. 1 shows an exemplary embodiment of a measuring device according to the invention, in the form of an electro-optical distance measuring device.

The distance measuring device 10 according to FIG. 1 has a housing 12 with a housing front surface 14 and a housing back surface 16. The housing 12 is essentially box-shaped, but has a visible waist 18 in the region of the middle of the longitudinal span of the measuring device. The housing is essentially composed of a rigid, stable plastic such as PAG GF 30.

On the top surface 20 of the housing 12, various function buttons 22 are provided for switching the unit on and off and for activating various measuring programs, as well as a measuring button 24 for triggering a measuring procedure. In addition, the top surface 20 of the measuring device 10 is equipped with an output unit in the form of a display 26 that is capable of displaying a measurement value detected, for example, as well as additional information about the measuring program selected.

On its housing front surface 14, the measuring device 10 has an outlet opening 28 for the measurement radiation, for example a modulated laser beam. A second opening 30 constitutes the entry opening for the measurement signal reflected against a measurement object.

In addition to a transmitter unit and a receiver unit for the measurement signal, the housing interior also contains a corresponding evaluation unit, which, based on the travel time of the measurement signal, in particular based on a comparative phase measurement of the modulated measurement signal, determines the distance of the measuring device from a measurement object to be measured.

In the region oriented away from the outlet opening and inlet opening for the measurement signal, the measuring device has a grip region 40, which is composed of a second, in particular elastic, material such as TPE with which the housing is extrusion coated in this region. The grip region 40, which is embodied in the form of a soft grip, encompasses not only parts of the side flanks 42 and 44 of the measuring device, but also regions of the housing top surface 20 and the housing bottom surface 46, not shown in the drawing. In particular, the grip region 40 is raised in relation to the region 48 of the function buttons 22 and the measuring button 24.

In this way, along with the elastically embodied grip region 40, an effective impact protection is simultaneously achieved. The impact protection can be further improved by also using an elastic material, for example the second material component of the grip region 40, in the region of the housing front surface 14. In this way, the rather rigid housing 12 of the measuring device can be largely protected from impacts of the kind that occur as a result of a fall, for example.

Figure 2:
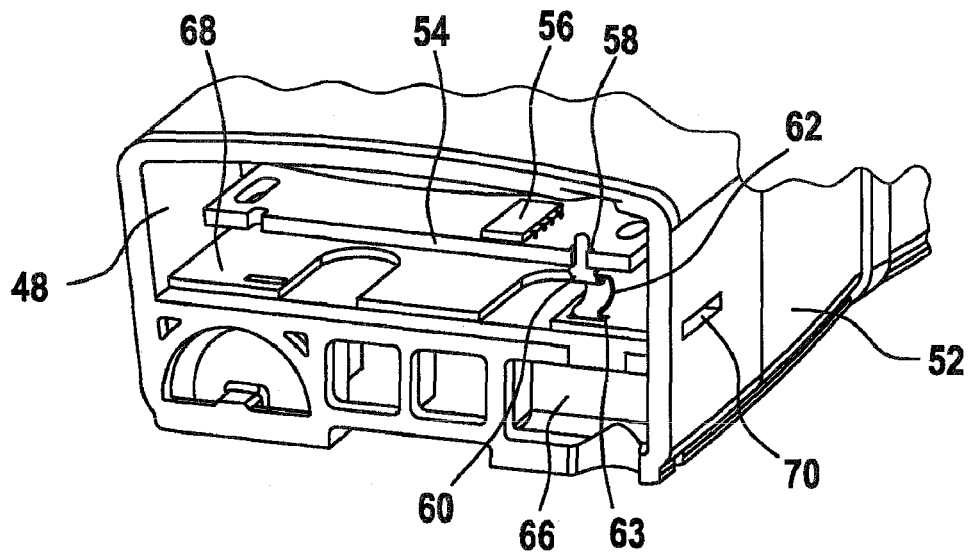
FIG. 2 is an enlarged detail of the housing interior of a measuring device according to the invention, in the region of the back end of the measuring device.

In a detailed depiction, FIG. 2 gives a view into the housing interior 48 in the direction of the arrow 16 in FIG. 1, with the back side 16 of the housing removed. For the sake of visibility, the second material comprising the grip region 40 has not been included in this depiction in FIG. 2, so that only a housing wall 52 is shown, which is composed of a first material. The housing interior 48 accommodates at least one printed circuit board 54 with a plurality of electronic components that include, for example, the transmitter unit, a receiver unit, and an evaluation unit for the electro-optical distance measuring device described in the exemplary embodiment. In the context of the description, these electronic components are represented in a rather symbolic fashion by an electronic component 56 that is situated on the printed circuit board 54 and is connected to other components via corresponding conductor structures. In addition, the printed circuit board 54 has at least one electrical contact, but as a rule several of them, for example in the form of solder points 58, which connect the electrically conducting structures of the at least one printed circuit board 54 to an electrical contacting means 60. Alternatively, the contacting of the contacting means could also be achieved merely by means of spring pressure, without soldering. The electrical contacting means 60 can, for example, be made resilient by providing them with a bend 62 in order to protect the rigid connection to the printed circuit board 54 in the event of concussion.

The electrical contacting means 58 exits the housing interior 48 through an opening in the housing wall that is not visible in FIG. 2 and, for example, with its second end oriented away from the solder point 58 in the housing interior, leads into a battery compartment 66 of the measuring device. From the point of view of the present invention, the battery compartment 66 is not considered to be situated in a housing interior, even though it can be closed, for example by means of a drawer or plate.

In order to seal the housing interior 48 in relation to the housing exterior, i.e. the battery compartment 66 for example, the opening of the electrical contacting means 60 through a sealing element 68, which is comprised of the same second material as the grip region 40, is initially sealed shut during the manufacture of the measuring device according to invention. During the assembly of the measuring device according to invention, the electrical contacting means 60 are then pushed through the sealing element 68 that closes the opening in the form of a thin film so that the sealing element is in fact routed from the housing interior 48 to the housing exterior, for example the battery compartment 66, but the sealing element 68 fits snugly against this contact, thus producing an effective seal of the transition from the housing interior to the housing exterior.

During the manufacture of the housing, which is composed of a first, as a rule relatively hard and solid material, in order for both the grip region 40 and the sealing element 68, which are comprised of a second, as a rule elastic material, to be advantageously produced at the same time, the outer housing wall 52 of the housing of the measuring device according to the invention has at least one opening 70. If the component comprising the grip element 40 forms an extrusion coating directly on the housing 12 during production, then the for example rubber-like soft material of the second material can travel through this opening 70 via conduits that can be embodied, for example, in the housing wall 64, to the opening 63, which connects the housing interior 48 to the housing exterior 66. The opening 63 is thus sealed by a thin skin of the second material. This sealing membrane, which functions as a sealing element of the housing interior 48 in relation to the housing exterior, can, during subsequent assembly of the measuring device, be easily penetrated by the electric contacting means 60 so that it is possible, for example, to produce an electrical connection between the battery compartment 66 and the printed circuit board 54 supporting the electronic components.

Figure 3:
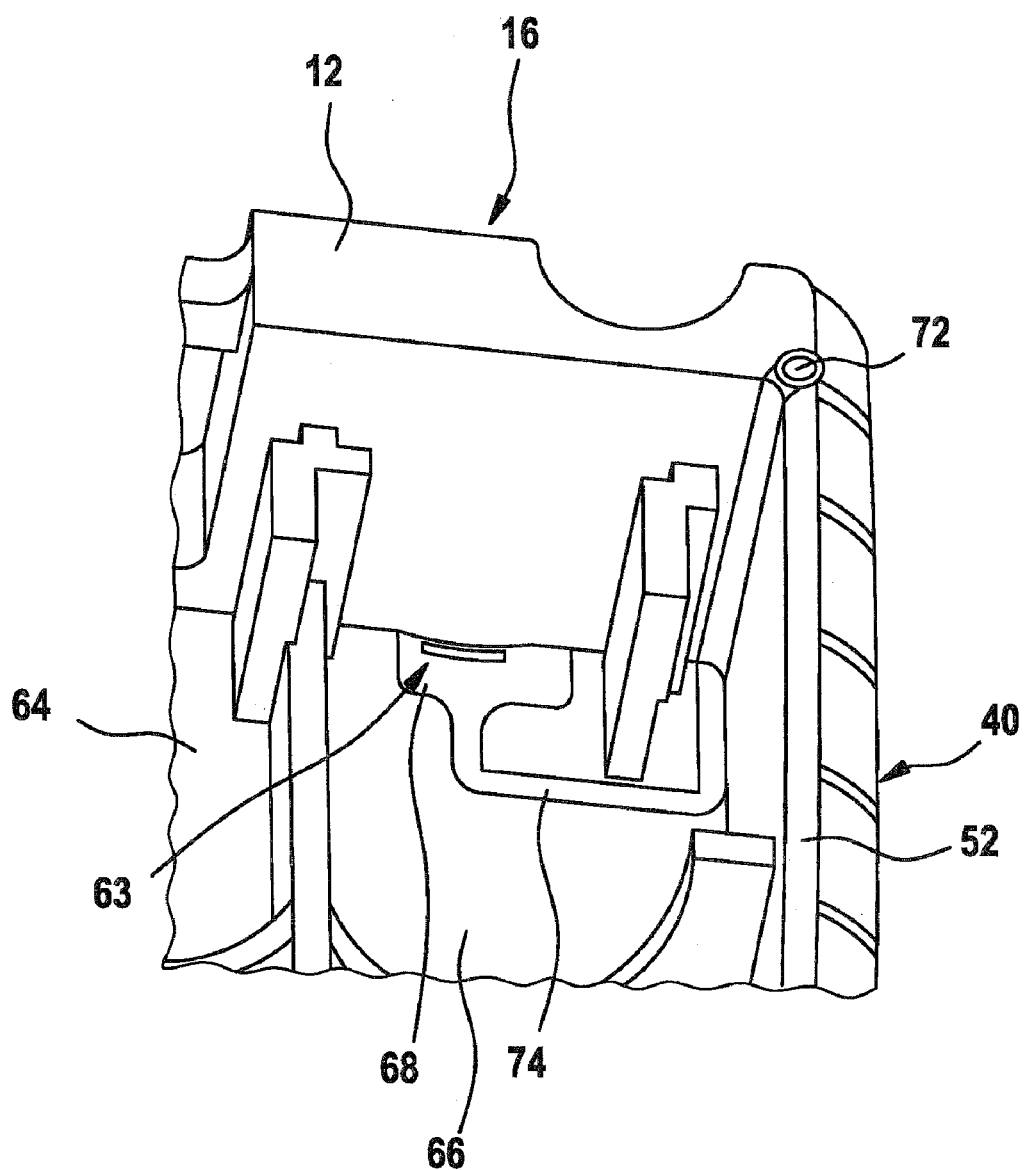
FIG. 3 is a detailed view of the underside of a measuring device according to FIG. 1.

FIG. 3 shows an alternative exemplary embodiment of the sealing element 68 for sealing the housing interior in relation to a housing exterior, for example a battery compartment. FIG. 3 is a view into the battery compartment 66 from the underside of the housing; for the sake of visibility, the plate that closes the housing underside is not shown in the drawing.

On the outside of the housing wall 52 of the measuring device, a grip region 40 comprised of a rubber-like material is provided, in particular by being injection-molded onto the housing, which is comprised of a first, rigid material. Via an opening 72 in the housing 12 of the measuring device 10, the second material travels into the battery compartment during production process and in it, is conveyed via a conduit, which is in particular embodied in the first material of the housing 12, to the location of the opening 63. During production process, the second material closes this opening 63 between the housing interior and the housing exterior, the latter of which is represented here by the battery compartment in the exemplary embodiment shown in FIG. 3.

As the production process of the device according to the invention continues, the membrane-like, thin layer of the sealing element 68 can easily be penetrated by means of the electrical contacts 60, as indicated in the depiction in FIG. 3. When this occurs, the thin membrane composed of the second elastic material fits snugly against the contact, thus making it possible to produce a reliable seal between the housing interior 48 and the housing exterior, for example the battery compartment shown in FIG. 3.

The production method according to the invention therefore makes it possible to produce a sealed connection between the housing interior and housing exterior without requiring the use of an additional sealing material to seal the housing. Thus, for example, when sealing the contacts between a battery compartment and the solder point of a printed circuit board accommodated in the housing interior, the soft component, which is present anyway and is embodied for example in the form of a grip, can also be used to produce the sealing element. The rubber-like soft material for the grip region is therefore likewise used for the purpose of sealing the housing interior.

The method according to the invention and a measuring device manufactured in accordance with this method, in particular a distance a measuring device for contactless distance measurement, are not limited to the exemplary embodiments shown in the drawings.

In particular, the measuring device is not limited to a distance measuring device or to an electro-optical distance measuring device.

In addition, the method according to the invention is not limited to the use of the material component of the grip region to produce at least one sealing element for the housing interior.

It is also possible for sealing contours to be injection molded, for example, onto one housing half of a housing constructed in half-shell fashion in order to seal the housing halves to each other.

It is also possible for the battery cover to be sealed in relation to the housing in the manner described above.

Furthermore, it is possible to injection mold an impact damper between the housing and the optics support of such a measuring device in the manner described above.

What is claimed is:

1. A distance measuring device for contactless distance measurement, having a housing (12) comprised of at least one first material, having at least one opening (63) situated in a housing interior (48) of the housing (12), having at least one electronic component (56) providing electro-optical measurement of distances and selected from the group consisting of a transmitter unit, a receiver unit, an evaluation unit, and a combination thereof, situated in the housing interior (48) of the housing (12), and having a second material that at least partially encompasses the housing (12) at a side of a housing exterior (66) and also seals the at least one opening (63) of the housing interior (48).

2. The measuring device as recited in claim 1, wherein the second material at least partially encompassing the housing (12) is integrally joined to a sealing element (68) of the opening (63) of the housing interior (48).

3. The measuring device as recited in claim 1,
wherein the second material is an elastic material.

4. The measuring device as recited in claim 1,
wherein the second material at least partially encompassing the housing (12) is embodied in the form of a grip region (40) of the housing (12).

5. A distance measuring device for contactless distance measurement, having a housing (12) comprised of at least one first material, having at least one opening (63) situated in a housing interior (48) of the housing (12), having at least one electronic component (56) providing electro-optical measurement of distances and selected from the group consisting of a transmitter unit, a receiver unit, an evaluation unit, and a combination thereof, situated in the housing interior (48) of the housing (12), and having a second material that at least partially encompasses the housing (12) at a side of a housing exterior (66) and also seals the at least one opening (63) of the housing interior (48) and
wherein the housing (12) has a battery compartment (66) that is sealed in relation to the housing interior (48) by the second material that at least partially encompasses the housing (12) at a side of a housing exterior (66) and separates the battery compartment (66) from the housing interior (48).

6. The measuring device as recited in claim 1,
wherein the measuring device is embodied in the form of an optoelectronic measuring device, in particular a laser distance measuring device.

7. A method for manufacturing a distance measuring device for contactless distance measurement, comprising the steps of providing a housing (12) comprised of at least one first material, having at least one opening (63) situated in a housing interior (48) of the housing (12), situating at least one electronic component (56) for electro-optical measurement of distances in the housing interior (48) of the housing (12) and selected from the group consisting of a transmitter unit, a receiver unit, an evaluation unit, and a combination thereof, at least partially encompassing the housing (12) at a side of a housing exterior (66)
with second material which is also embodied in the form of a sealing element (68), sealing the at least one opening

(63) of the housing interior (48) with the second material embodied in the form of the sealing element (68) and at least partly encompassing the housing (12) at the side of the housing exterior (66).

8. The method as recited in claim 7,
further comprising integrally joining the second material at least partially encompassing the housing (12) to the at least one sealing element (68) of the housing interior (48).

9. The method as recited in claim 7,
further comprising using the second material to extrusion coat the housing (12).

10. The method as recited in claim 9,
further comprising embodying the second material with which the housing (12) is extrusion coated as a grip region (40) of the housing (12).

11. The method as recited in claim 9,
further comprising producing the housing (12) and the grip region (40) using a combined two-component injection molding process.

12. A method for manufacturing a distance measuring device for contactless distance measurement, comprising the steps of providing a housing (12) comprised of at least one first material, having at least one opening (63) situated in a housing interior (48) of the housing (12), situating at least one electronic component (56) for electro-optical measurement of distances in the housing interior (48) of the housing (12) and selected from the group consisting of a transmitter unit, a receiver unit, an evaluation unit, and a combination thereof, at least partially encompassing the housing (12) at a side of a housing exterior (66),
with a second material which is also embodied in the form of a sealing element (68), sealing the at least one opening (63) the housing interior (48) with the second material embodied in the form of the sealing element (68) and at least partly encompassing the housing (12) at the side of the housing exterior (66),
and providing inside the housing (12), at least one conduit (74), which makes it possible for the second material from the housing exterior to travel to and seal the at least one opening (63) of the housing interior (48).

13. The method as recited in claim 7,
further comprising routing electrical contacting means (60) of the housing interior through the at least one sealing element (68).

14. A distance measuring device for contactless distance measurement, having a housing (12) comprised of at least one first material, having at least one local opening (63) of a housing interior (48) formed in a single wall of the housing (12) and situated in a housing interior (48) of the housing (12), having at least one electronic component (56) for electro-optical measurement of distances and selected from the group consisting of a transmitter unit, a receiver unit, an evaluation unit, and a combination thereof, situated in the housing interior (48) of the housing (12), and having a second material that at least partially encompasses the housing (12) at a side of a housing exterior (66) and also seals the at least one opening (63) of the housing interior (48) situated in the single wall of the housing (12).

15. A distance measuring device for contactless distance measurement, having a housing (12) comprised of at least one first material, having at least one local opening (63) of a housing interior (48) formed in a single wall of the housing (12) and situated in a housing interior (48) of the housing (12), having at least one electronic component (56) for electro-optical measurement of distances and selected from the group consisting of a transmitter unit, a receiver unit, an evaluation unit, and a combination thereof, situated in the housing interior (48) of the housing (12), and having a second material that at least partially encompasses the housing (12) at a side of a housing exterior (66) and also seals the at least one local opening (63) of the housing interior (48) made in a single wall of the housing (12) and
wherein the housing (12) has a battery compartment (66) that by the second material that at least partially encompasses the housing (12) at a side of a housing exterior (66) is sealed in relation to the housing interior (48) and separates the battery compartment (66) from the housing interior (48).

16. A method for manufacturing a distance measuring device for contactless distance measurement, comprising the steps of providing a housing (12) comprised of at least one first material, forming at least one local opening (63) of a housing interior (48) in a single wall of the housing (12) and situated in a housing interior (48) of the housing (12), at least partially encompassing the housing (12) at a side of a housing exterior (66)
with a second material which is also embodied in the form of a sealing element (68), and sealing the at least one local opening (63) of the housing interior (48) made in the single wall of the housing (12) with the second material embodied in the form of the sealing element (68) and at least partly encompassing the housing (12) at the side of the housing exterior (66).

17. A method for manufacturing a distance measuring device for contactless distance measurement, comprising the steps of providing a housing (12) comprised of at least one first material, having at least one local opening (63) of a housing interior (48) formed in a single wall of the housing (12) and situated in a housing interior (48) of the housing (12), at a side of a housing exterior (66)
with a second material which is also embodied in the form of a sealing element (68), sealing the at least one local opening (63) of the housing interior (48) made in a single wall of the housing (12) and situated in the housing interior (48) at the side of the housing interior (48), with the second material embodied in the form of the sealing element (68) and at least partly encompassing the housing (12) at the side of the housing exterior (66),
and providing inside the housing (12), at least one conduit (74), which makes it possible for the second material from the housing exterior to travel to and seal the at least one opening (63) of the housing interior (48).

\* \* \* \* \*